United States Patent
Cha et al.

(10) Patent No.: US 9,911,381 B2
(45) Date of Patent: Mar. 6, 2018

(54) DISPLAY DEVICE AND DISPLAY PANEL

(71) Applicant: Samsung Electronics Co., Ltd., Suwon-si, Gyeonggi-do (KR)

(72) Inventors: Nam Goo Cha, Hwaseong-si (KR); Young Soo Park, Yongin-si (KR); Sung Hyun Sim, Uiwang-si (KR); Je Won Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 44 days.

(21) Appl. No.: 14/825,670

(22) Filed: Aug. 13, 2015

(65) Prior Publication Data

US 2016/0125804 A1    May 5, 2016

(30) Foreign Application Priority Data

Nov. 5, 2014  (KR) .................. 10-2014-0152522

(51) Int. Cl.
  *G09G 3/32*      (2016.01)
  *G09G 3/3233*   (2016.01)
  *H01L 27/15*    (2006.01)

(52) U.S. Cl.
  CPC ... *G09G 3/3233* (2013.01); *G09G 2300/0426* (2013.01); *G09G 2300/0452* (2013.01); *G09G 2300/0852* (2013.01); *G09G 2310/0297* (2013.01); *H01L 27/156* (2013.01)

(58) Field of Classification Search
  CPC ......... G09G 3/3233; G09G 2300/0426; G09G 2300/0852; G09G 2310/0297; H01L 27/15
  See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |

(Continued)

FOREIGN PATENT DOCUMENTS

| | | |
|---|---|---|
| JP | 2004-079933 A | 3/2004 |
| JP | 4552828 B2 | 9/2010 |

(Continued)

*Primary Examiner* — Sahlu Okebato
(74) *Attorney, Agent, or Firm* — Harness, Dickey & Pierce, P.L.C.

(57) ABSTRACT

There is provided a display device including a plurality of pixels. Each of the plurality of pixels may include a plurality of switching devices, at least one capacitor, and a semiconductor light-emitting device. The display device may further include a driving circuit configured to apply currents to the semiconductor light-emitting device through the plurality of switching devices and at least one capacitor. The semiconductor light-emitting device may emit red light, green light, and blue light through the currents applied by the driving circuit.

15 Claims, 7 Drawing Sheets

(56) References Cited

U.S. PATENT DOCUMENTS

| | | | |
|---|---|---|---|
| 7,288,758 | B2 | 10/2007 | Sherrer et al. |
| 7,319,044 | B2 | 1/2008 | Han et al. |
| 7,501,656 | B2 | 3/2009 | Han et al. |
| 7,709,857 | B2 | 5/2010 | Kim et al. |
| 7,759,140 | B2 | 7/2010 | Lee et al. |
| 7,781,727 | B2 | 8/2010 | Sherrer et al. |
| 7,790,482 | B2 | 9/2010 | Han et al. |
| 7,940,350 | B2 | 5/2011 | Jeong |
| 7,959,312 | B2 | 6/2011 | Yoo et al. |
| 7,964,881 | B2 | 6/2011 | Choi et al. |
| 7,985,976 | B2 | 7/2011 | Choi et al. |
| 7,994,525 | B2 | 8/2011 | Lee et al. |
| 8,008,683 | B2 | 8/2011 | Choi et al. |
| 8,013,352 | B2 | 9/2011 | Lee et al. |
| 8,049,161 | B2 | 11/2011 | Sherrer et al. |
| 8,129,711 | B2 | 3/2012 | Kang et al. |
| 8,179,938 | B2 | 5/2012 | Kim |
| 8,263,987 | B2 | 9/2012 | Choi et al. |
| 8,263,990 | B2 | 9/2012 | Armitage |
| 8,324,646 | B2 | 12/2012 | Lee et al. |
| 8,399,944 | B2 | 3/2013 | Kwak et al. |
| 8,432,511 | B2 | 4/2013 | Jeong |
| 8,459,832 | B2 | 6/2013 | Kim |
| 8,502,242 | B2 | 8/2013 | Kim |
| 8,536,604 | B2 | 9/2013 | Kwak et al. |
| 8,735,867 | B2 | 5/2014 | Seong et al. |
| 8,735,931 | B2 | 5/2014 | Han et al. |
| 8,766,295 | B2 | 7/2014 | Kim |
| 2008/0251796 | A1* | 10/2008 | Lee ................ H01L 27/153 257/88 |
| 2010/0225831 | A1* | 9/2010 | Takeuchi .......... G02F 1/136213 348/739 |
| 2011/0102417 | A1* | 5/2011 | Chen .................. G09G 3/3233 345/214 |
| 2012/0061641 | A1* | 3/2012 | Seong ................ H01L 27/156 257/13 |
| 2013/0099199 | A1 | 4/2013 | Cha et al. |
| 2013/0112944 | A1 | 5/2013 | Cha et al. |
| 2013/0313514 | A1 | 11/2013 | Hwang et al. |
| 2013/0313583 | A1 | 11/2013 | Hwang et al. |
| 2014/0124732 | A1 | 5/2014 | Cha et al. |
| 2014/0129834 | A1 | 5/2014 | Brill et al. |
| 2014/0166974 | A1 | 6/2014 | Yoo et al. |
| 2014/0209858 | A1 | 7/2014 | Cha et al. |
| 2014/0209859 | A1 | 7/2014 | Cha et al. |
| 2014/0217357 | A1 | 8/2014 | Yoo et al. |
| 2014/0246647 | A1 | 9/2014 | Cha et al. |
| 2015/0028356 | A1* | 1/2015 | Lee ................ H01L 27/15 257/79 |
| 2015/0102365 | A1 | 4/2015 | Cha et al. |

FOREIGN PATENT DOCUMENTS

| | | |
|---|---|---|
| JP | 5309386 B2 | 10/2013 |
| KR | 10-0696445 B1 | 3/2007 |
| KR | 10-2012-0058137 A | 6/2012 |
| KR | 10-2012-0065605 A | 6/2012 |
| KR | 10-2012-0065606 A | 6/2012 |
| KR | 10-2012-0065607 A | 6/2012 |
| KR | 10-2012-0065608 A | 6/2012 |
| KR | 10-2012-0065610 A | 6/2012 |
| KR | 10-2012-0067157 A | 6/2012 |
| KR | 10-2012-0079310 A | 7/2012 |
| KR | 10-2012-0079670 A | 7/2012 |
| KR | 10-2012-0079730 A | 7/2012 |
| KR | 10-2012-0084119 A | 7/2012 |
| KR | 10-2013-0025716 A | 3/2013 |
| KR | 10-2013-0025856 A | 3/2013 |
| KR | 10-2013-0040518 A | 4/2013 |
| KR | 10-2013-0051240 A | 5/2013 |
| KR | 10-1258583 B1 | 5/2013 |
| KR | 10-2013-0107537 A | 10/2013 |
| KR | 10-2013-0130543 A | 12/2013 |
| KR | 10-2013-0131217 A | 12/2013 |
| KR | 10-2013-0139113 A | 12/2013 |
| KR | 10-2014-0058012 A | 5/2014 |
| KR | 10-2014-0077614 A | 6/2014 |
| KR | 10-2014-0077616 A | 6/2014 |
| KR | 10-2014-0096970 A | 8/2014 |
| KR | 10-2014-0096979 A | 8/2014 |
| KR | 10-2014-0096980 A | 8/2014 |
| KR | 10-2014-0099803 A | 8/2014 |
| KR | 10-2015-0043152 A | 4/2015 |
| KR | 10-2015-0054383 A | 5/2015 |

* cited by examiner

DISPLAY DEVICE AND DISPLAY PANEL

CROSS-REFERENCE TO RELATED APPLICATION

This application claims the priority and benefit of Korean Patent Application No. 10-2014-0152522 filed on Nov. 5, 2014, with the Korean Intellectual Property Office, the inventive concept of which is incorporated herein by reference.

BACKGROUND

The present inventive concept relates to a display device and a display panel.

Among flat panel display (FPD) devices, an organic light-emitting display device, unlike a liquid crystal display (LCD) device, may not require an additional backlight unit, since an organic light-emitting diode (OLED), emitting light by itself when current flows therethrough, is disposed in each pixel. Due to such an advantage, the application range of organic light-emitting display devices has been gradually broadened.

However, since the OLED disposed in each pixel of the organic light-emitting display device may have a low light conversion efficiency, it may be difficult to apply the organic light-emitting display device to a low power-consumption apparatus. Accordingly, when it is applied to a wearable electronic device which is currently commercialized in various fields, battery power consumption may increase. In addition, since a single pixel may include one OLED emitting one of red light (R), green light (G), and blue light (B), the quality of colored light emitted by the organic light-emitting display device may change, according to arrangements of R, G, and B pixels.

SUMMARY

An aspect of the present inventive concept may provide a display device and a display panel that are operated with low levels of power consumption and allow more natural colors of light to be emitted thereby by associating pixels and light-emitting devices in one-to-one correspondence.

According to an aspect of the present inventive concept, a display device may include a plurality of pixels including a plurality of switching devices, at least one capacitor, and a semiconductor light-emitting device, and a driving circuit configured to apply currents to the semiconductor light-emitting device through the plurality of switching devices and at least one capacitor. Each of the plurality of pixels may include each semiconductor light-emitting device, and the semiconductor light-emitting device may emit red light, green light, and blue light through the currents applied by the driving circuit.

In some example embodiments of the present inventive concept, the semiconductor light-emitting device may include first to third light-emitting areas emitting red light, green light, and blue light.

In other example embodiments of the present inventive concept, the first to third light-emitting areas may respectively emit red light, green light, and blue light through currents applied through one common n-type electrode and different first to third p-type electrodes.

In other example embodiments of the present inventive concept, at least one of the common n-type electrode and the first to third p-type electrodes may be mounted on a substrate on which the plurality of switching devices and the at least one capacitor are arranged, using a wire process.

In other example embodiments of the present inventive concept, the semiconductor light-emitting device may be bonded on a substrate on which the plurality of switching devices and at least one capacitor are arranged, using a flip-chip process.

In other example embodiments of the present inventive concept, the semiconductor light-emitting device may include a plurality of nanocores including n-type semiconductors, and active layers and p-type semiconductor layers sequentially formed on the plurality of nanocores.

In other example embodiments of the present inventive concept, distances between the plurality of nanocores may be different in the first to third light-emitting areas.

In other example embodiments of the present inventive concept, the semiconductor light-emitting device may include light-blocking areas disposed at boundaries between the first to third light-emitting areas.

In other example embodiments of the present inventive concept, each of the plurality of pixels may include at least one switching thin-film transistor (TFT) and at least one driving TFT.

According to another aspect of the present inventive concept, a display panel may include a plurality of pixels. Each of the plurality of pixels may include a pixel circuit including a plurality of switching devices and at least one capacitor, and one semiconductor light-emitting device emitting red light, green light, and blue light.

In some example embodiments of the present inventive concept, the one semiconductor light-emitting device may include a plurality of light-emitting nanostructures including a plurality of nanocores including n-type semiconductors, and active layers and p-type semiconductor layers sequentially formed on the plurality of nanocores.

In other example embodiments of the present inventive concept, the plurality of light-emitting nanostructures may be separately disposed in first to third light-emitting areas by a plurality of light-blocking areas.

In other example embodiments of the present inventive concept, the plurality of nanocores may be connected to one common n-type electrode, and the p-type semiconductor layers may be connected to first to third p-type electrodes respectively in the first to third light-emitting areas.

In other example embodiments of the present inventive concept, the first to third p-type electrodes may be connected to different switching devices among the plurality of switching devices.

In other example embodiments of the present inventive concept, the light-emitting nanostructures disposed in the first light-emitting area may emit red light, the light-emitting nanostructures disposed in the second light-emitting area may emit green light, and the light-emitting nanostructures disposed in the third light-emitting area may emit blue light.

According to another aspect of the present inventive concept, a display panel may include a plurality of pixels. Each of the plurality of pixels may include one semiconductor light-emitting device including first to third light-emitting areas which emit different colors of light through currents applied through a common n-type electrode and first to third p-type electrodes, and first to third pixel circuits connected to the first to third p-type electrodes in order to apply currents to the first to third light-emitting areas.

In some example embodiments of the present inventive concept, each of the first to third pixel circuits may include a plurality of switching devices and at least one capacitor.

In other example embodiments of the present inventive concept, the first to third pixel circuits may include a common reference line and apply a reference voltage to the common n-type electrode through the common reference line.

In other example embodiments of the present inventive concept, the first light-emitting area may emit red light, the second light-emitting area may emit green light, and the third light-emitting area may emit blue light.

In other example embodiments of the present inventive concept, the semiconductor light-emitting device may include a plurality of light-emitting nanostructures including a plurality of nanocores including n-type semiconductors, and active layers and p-type semiconductor layers sequentially formed on the plurality of nanocores. The plurality of light-emitting nanostructures may be arranged at different distances in the first to third light-emitting areas.

BRIEF DESCRIPTION OF DRAWINGS

The above and other aspects, features and advantages of the present inventive concept will be more clearly understood from the following detailed description taken in conjunction with the accompanying drawings, in which.

DETAILED DESCRIPTION

Figure 1:
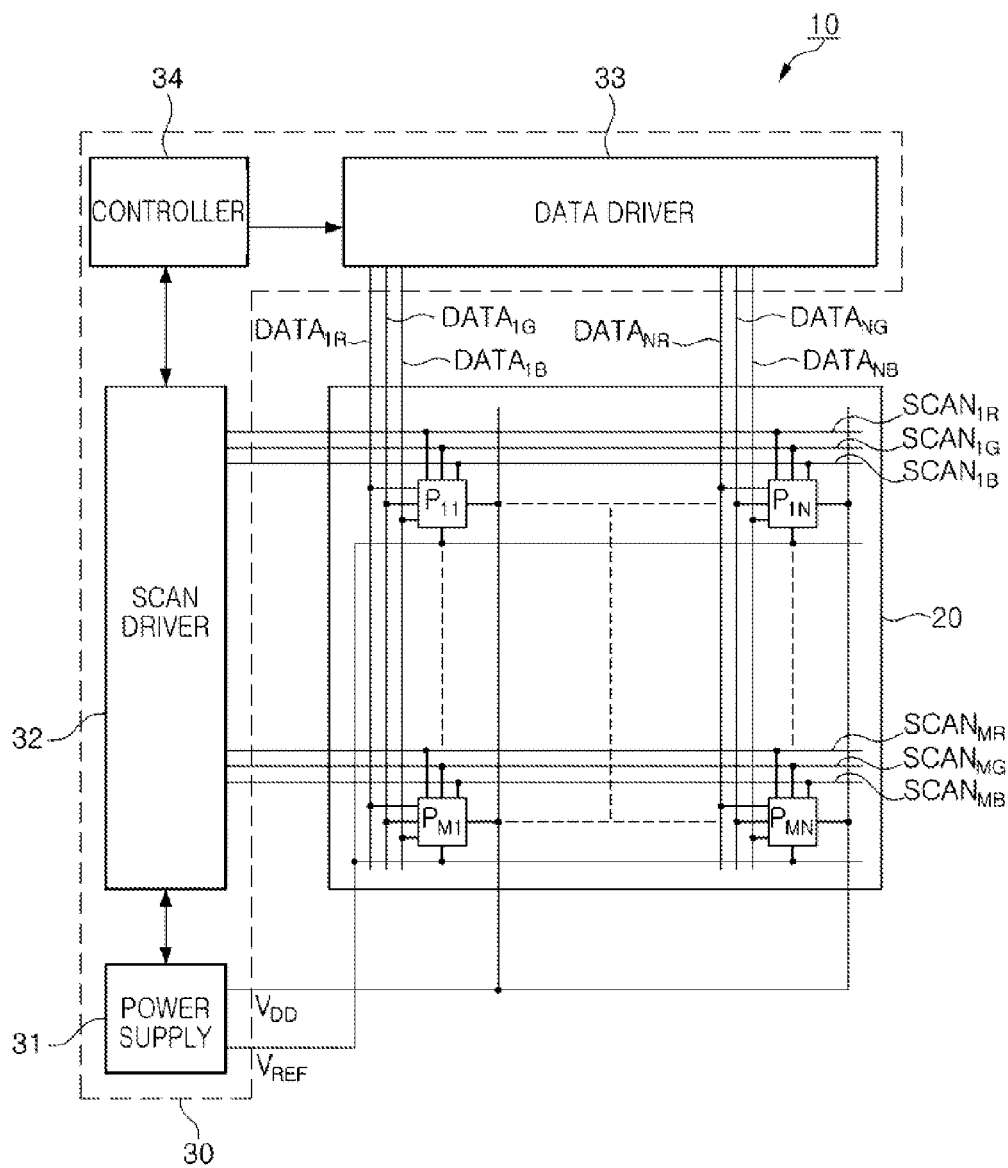
FIG. 1 is a block diagram schematically illustrating a display device according to an example embodiment of the present inventive concept.

Various embodiments will now be described more fully with reference to the accompanying drawings in which some embodiments are shown. The present disclosure may, however, be embodied in different forms and should not be construed as limited to the embodiments set forth herein. Rather, these embodiments are provided so that this disclosure is thorough and complete and fully conveys the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, maybe used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Meanwhile, when an embodiment can be implemented differently, functions or operations described in a particular block may occur in a different way from a flow described in the flowchart. For example, two consecutive blocks may be performed simultaneously, or the blocks may be performed in reverse according to related functions or operations.

Example embodiments of the present inventive concept will now be described in detail with reference to the accompanying drawings.

The inventive concept may, however, be exemplified in many different forms and should not be construed as being limited to the specific embodiments set forth herein. Rather, these embodiments are provided so that this disclosure will be thorough and complete, and will fully convey the scope of the inventive concept to those skilled in the art. In the drawings, the shapes and dimensions of elements may be exaggerated for clarity, and the same reference numerals will be used throughout to designate the same or like elements.

FIG. 1 is a block diagram schematically illustrating a display device according to an example embodiment of the present inventive concept.

Referring to FIG. 1, a display device 10 according to an example embodiment of the present inventive concept may include a display panel 20 having (M×N) pixels (where M and N are natural numbers equal to or greater than two) and a driving circuit 30 for driving each pixel included in the display panel 20 in order to display an image. The driving circuit 30 may include a power supply 31, a scan driver 32, a data driver 33, and a controller 34.

The display panel 20 may include a plurality of pixels $P_{11}$ to $P_{MN}$ arranged in the form of a matrix having M rows and N columns. Each of the plurality of pixels $P_{11}$ to $P_{MN}$ may receive a driving voltage $V_{DD}$ and a reference voltage $V_{REF}$ from the power supply 31. In addition, each of the plurality of pixels $P_{11}$ to $P_{MN}$ may be connected to the scan driver 32 through a plurality of scan lines and connected to the data driver 33 through a plurality of data lines.

For example, a pixel $P_{11}$ located at a first row and a first column may be connected to the scan driver 32 through three scan lines $SCAN_{1R}$, $SCAN_{1G}$, and $SCAN_{1B}$, and connected to the data driver through three data lines $DATA_{1R}$, $DATA_{1G}$, and $DATA_{1B}$. The controller 34 may drive a plurality of light-emitting areas of a nitride-based semiconductor light-emitting device included in the pixel $P_{11}$ through each of the scan lines $SCAN_{1R}$, $SCAN_{1G}$, and $SCAN_{1B}$ and data lines $DATA_{1R}$, $DATA_{1G}$, and $DATA_{1B}$ connected to the pixel P.

Each of the plurality of pixels $P_{11}$ to $P_{MN}$ may include one nitride-based semiconductor light-emitting device. That is, each of the pixels $P_{11}$ to $P_{MN}$ may include one nitride-based semiconductor light-emitting device, and the display panel 20 may include a total of M×N nitride-based semiconductor light-emitting devices. The nitride-based semiconductor light-emitting device included in each of the pixels $P_{11}$ to $P_{MN}$ may emit red light, green light, and blue light. The nitride-based semiconductor light-emitting device included in each of the pixels $P_{11}$ to $P_{MN}$ may include first to third light-emitting areas respectively emitting red light, green light, and blue light. The first to third light-emitting areas may emit light by different scan lines $SCAN_{1R}$, $SCAN_{1G}$, and $SCAN_{1B}$ and data lines $DATA_{1R}$, $DATA_{1G}$, and $DATA_{1B}$.

In order to emit red light, green light, and blue light, the nitride-based semiconductor light-emitting device included in each of the pixels $P_{11}$ to $P_{MN}$ may include a plurality of light-emitting nanostructures. In each of the first to third light-emitting areas emitting different colors of light, the plurality of light-emitting nanostructures may have different intervals, different widths, or different heights. Further, in order to prevent red light, green light, and blue light from being mixed in the nitride-based semiconductor light-emitting device, light-blocking areas may be formed between the first to third light-emitting areas.

The driving circuit 30 may transmit a predetermined or desired electrical signal to the plurality of pixels $P_{11}$ to $P_{MN}$ included in the display panel 20 in order to display image data transmitted from an external device. The power supply 31 may supply the driving voltage $V_{DD}$ and the reference voltage $V_{REF}$ required for the nitride-based semiconductor light-emitting device included in each of the pixels $P_{11}$ to $P_{MN}$ to emit light to each of the pixels $P_{11}$ to $P_{MN}$.

The controller 34 may generate a predetermined or desired timing control signal to display the image data transmitted from the external device, and control operation timing of the scan driver 32 and the data driver 33, based on the timing control signal. In some example embodiment, the scan driver 32 may generate scan signals shifted by a predetermined or desired time period according to the timing control signal transmitted from the controller 34 and apply the scan signals to a plurality of scan lines $SCAN_{1R}$ to $SCAN_{MR}$, $SCAN_{1G}$ to $SCAN_{MG}$, and $SCAN_{1B}$ and $SCAN_{MB}$.

The data driver 33 may control a plurality of data lines $DATA_{1R}$ to $DATA_{NR}$, $DATA_{1G}$ to $DATA_{NG}$, and $DATA_{1B}$ to $DATA_{NB}$ according to the timing control signal generated in the controller 34 in order to apply the driving voltage $V_{DD}$ and the reference voltage $V_{REF}$ to each of the pixels $P_{11}$ to $P_{MN}$. In some example embodiment, the data driver 33 may control the data lines $DATA_{1R}$ to $DATA_{NR}$, $DATA_{1G}$ to $DATA_{NG}$, and $DATA_{1B}$ to $DATA_{NB}$ connected to the pixels $P_{11}$ to $P_{MN}$ to which a scan signal is applied among the plurality of scan lines $SCAN_{1R}$ to $SCAN_{MR}$, $SCAN_{1G}$ to $SCAN_{MG}$, and $SCAN_{1B}$ and $SCAN_{MB}$ in order to supply the driving voltage $V_{DD}$ and the reference voltage $V_{REF}$ to the pixels $P_{11}$ to $P_{MN}$. When the nitride-based semiconductor light-emitting device emits in the pixels $P_{11}$ to $P_{MN}$ to which the driving voltage $V_{DD}$ and the reference voltage $V_{REF}$ are supplied, the display device 10 may display an image.

Figure 2:
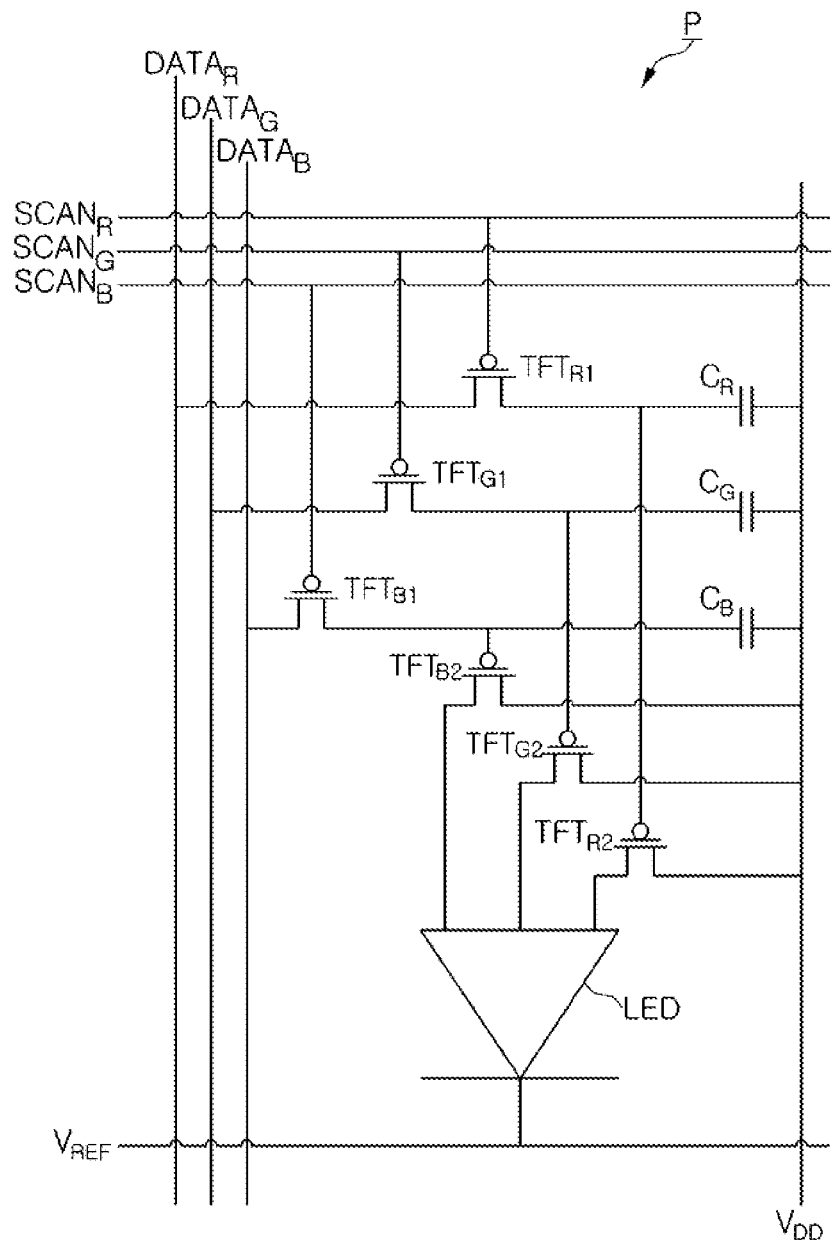
FIG. 2 is a circuit diagram illustrating pixels included in a display device and a display panel according to an example embodiment of the present inventive concept.

FIG. 2 is a circuit diagram illustrating pixels included in a display device and a display panel according to an example embodiment of the present inventive concept.

Referring to FIG. 2, a pixel P included in a display panel 20 may include a plurality of switching devices $TFT_{R1}$ to $TFT_{B2}$, a plurality of capacitors $C_R$ to $C_B$, and one semiconductor light-emitting device (LED). The semiconductor LED may be a nitride-based semiconductor light-emitting device, and include an n-type semiconductor layer supplying electrons, a p-type semiconductor layer supplying holes, and an active layer disposed between the n-type semiconductor layer and the p-type semiconductor layer. In addition, the semiconductor LED may include one n-type electrode receiving a reference voltage $V_{REF}$ and a plurality of p-type electrodes receiving a driving voltage $V_{DD}$ through the plurality of switching devices $TFT_{R1}$ to $TFT_{B2}$ and capacitors $C_R$ to $C_B$.

In some example embodiments, the semiconductor LED may include first to third light-emitting areas emitting red light, green light, and blue light, and the plurality of p-type electrode may include first to third p-type electrodes respectively corresponding to the first to third light-emitting areas. When the first light-emitting area emits red light, the first p-type electrode may receive the driving voltage $V_{DD}$ through red switching devices $TFT_{R1}$ and $TFT_{R2}$ and a red capacitor $C_R$. Similarly, when the second light-emitting area emits green light, the second p-type electrode may receive the driving voltage $V_{DD}$ through green switching devices $TFT_{G1}$ and $TFT_{G2}$ and a green capacitor $C_G$. In addition, when the third light-emitting area emits blue light, the third p-type electrode may receive the driving voltage $V_{DD}$ through blue switching devices $TFT_{B1}$ and $TFT_{B2}$ and a blue capacitor $C_B$.

As illustrated in FIG. 2, a gate terminal of a first red switching device $TFT_{R1}$ may be connected to a red scan line $SCAN_R$. Accordingly, when the first red switching device $TFT_{R1}$ turns on by receiving a scan signal through the red scan line $SCAN_R$, a data signal applied to a red data line $DATA_R$ may store charges in the red capacitor $C_R$. In addition, a data signal applied to the red data line $DATA_R$ may turn on a second red switching device $TFT_{R2}$, and the driving voltage $V_{DD}$ may be applied to a first p-type electrode of the semiconductor LED in order to generate red light in the first light-emitting area of the semiconductor LED. Here, even if the scan signal is disconnected, the first light-emitting areas of the semiconductor LED may continue generating red light for a predetermined or desired time by the charges stored in the red capacitors $C_R$.

Similar to the method described above, the second and third light-emitting areas of the semiconductor LED may generate green light and blue light. Accordingly, since each of the red light, the green light, and the blue light generated in one semiconductor LED may be independently controlled, the display panel 20 may be implemented with one semiconductor LED arranged in each pixel P. Thus, in the display device 10 according to the example embodiment of the present inventive concept, the total number of semiconductor LEDs may be the total number of pixels $P_{11}$ to $P_{MN}$ included in the display panel 20, that is, (M×N).

Meanwhile, in FIG. 2, a pixel circuit is implemented in a (2T-1C) structure in which two of the plurality of switching devices $TFT_{R1}$ to $TFT_{B2}$ included in one pixel P are assigned to each of the first to third light-emitting areas of the semiconductor LED, and one of the plurality of capacitors $C_R$ to $C_B$ included in one pixel P is assigned to each of first to third light-emitting areas, but is not limited thereto. That is, each pixel P may include various types of pixel circuits different from that illustrated in FIG. 2, for example, a voltage program type pixel circuit, a current program type pixel circuit, or a current-mirror type pixel circuit.

FIGS. 3 to 6 are cross-sectional views illustrating semiconductor light-emitting devices applicable to a display device and a display panel according to example embodiments of the present inventive concept.

Figure 3:
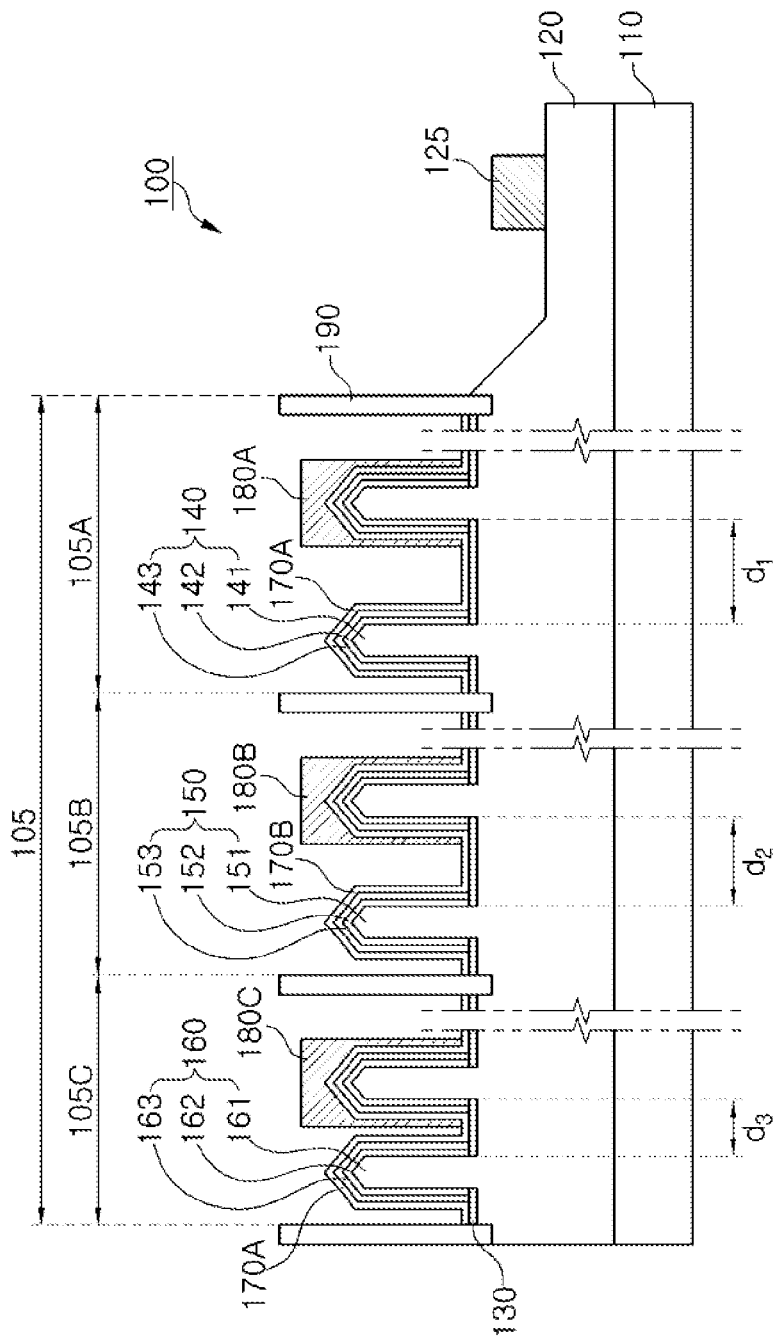
FIGS. 3 to 6 are views illustrating semiconductor light-emitting devices applicable to a display device and a display panel according to example embodiments of the present inventive concept.

First, referring to FIG. 3, a semiconductor light-emitting device 100 applicable to a display device 10 and a display panel 20 according to an example embodiment of the present inventive concept may have an epi-up structure. The semiconductor light-emitting device 100 may include a substrate 110, a base layer 120 disposed on the substrate 110, an insulating layer 130 disposed on the base layer 120, and a plurality of light-emitting nanostructures 140, 150, and 160 formed on the base layer 120.

The substrate 110 may be an insulating, conductive, or a semiconductor substrate. For example, the substrate 110 may include sapphire, SiC, Si, $MgAl_2O_4$, MgO, $LiAlO_2$, $LiGaO_2$, GaN, or the like. The base layer 120 may be a nitride semiconductor satisfying $Al_xIn_yGa_{1-x-y}N$ (0≤x≤1, 0≤y≤1, and 0≤x+y≤1), and may be doped with n-type impurities, such as Si, to have a specific-type conductivity. Meanwhile, the base layer 120 may be formed on the substrate 110. The base layer 120 may function not only to provide a growth plane for the light-emitting nanostructures 140, 150, and 160, but also to electrically connect a polarity of one sides of the plurality of light-emitting nanostructures 140, 150, and 160.

The insulating layer 130 may be formed on the base layer 120 and provide a plurality of openings in order to form the plurality of light-emitting nanostructures 140, 150, and 160. The insulating layer 130 may be a kind of mask layer having the plurality of openings. By disposing the insulating layer 130 on the base layer 120 and growing the base layer 120 through the plurality of openings, nanocores 141, 151, and 161 may be formed. The nanocores 141, 151, and 161 may include an n-type semiconductor. For example, the nanocores 141, 151, and 161 may include n-type GaN. Side surfaces of the nanocores 141, 151, and 161 may be a non-polar m-plane. Meanwhile, the insulating layer 130 may be an insulating material and include silicon oxide or silicon nitride. For example, the insulating layer 130 may include $SiO_2$, SiN, $TiO_2$, $Si_3N_4$, $Al_2O_3$, TiN, AlN, $ZrO_2$, TiAlN, TiSiN, or the like.

Active layers 142, 152, and 162 and p-type semiconductor layers 143, 153, and 163 may be sequentially formed on the nanocores 141, 151, and 161. The active layers 142, 152, and 162 may have a multi-quantum well (MQW) structure in which quantum well layers and quantum barrier layers are alternately stacked. For example, when the active layers 142, 152, and 162 are a nitride semiconductor, a GaN/InGaN structure may be used. Alternatively, a single quantum well (SQW) structure maybe used. The p-type semiconductor layers 143, 153, and 163 may include p-type $Al_xIn_yGa_{1-x-y}N$, wherein 0≤x≤1, 0≤y≤1, 0≤x+y≤1. Transparent conductive layers 170A, 170B, and 170C including a transparent conductive material, such as ITO, ZnO, or IZO, may be formed on the p-type semiconductor layers 143, 153, and 163.

The active layers 142, 152, and 162 may be formed to cover side and upper surfaces of the nanocores 141, 151, and 161. In the example embodiment, the active layers 142, 152, and 162 maybe formed on respective surfaces of the nanocores 141, 151, and 161 in one batch process. Here, when diameters or heights of the nanocores 141, 151, and 161, or distances between the nanocores 141, 151, and 161 differ from each other, the active layers 142, 152, and 162 having different compositions may be formed due to differences in lattice constants, specific surface areas, and strains. Thus, wavelengths of light generated in the light-emitting nanostructures 140, 150, and 160 may differ from each other. More specifically, when the quantum well layers of the active layers are $In_xGa_{1-x}N$ (0≤x≤1), contents of indium (In) of nanocores may vary depending on diameters of the nanocores. As a result, wavelengths of light emitted from the quantum well layers may differ from each other.

The semiconductor light-emitting device 100 may include light-emitting areas 105, and the light-emitting areas 105 may include first, second, third light-emitting areas 105A, 105B, and 105C generating red light, green light, and blue light, respectively. Light-blocking areas 190 may be disposed between the first to third light-emitting areas 105A, 105B, and 105C. The light-blocking areas 190 may electrically isolate the p-type semiconductor layers 143, 153, and 163 respectively included in the first to third light-emitting areas 105A, 105B, and 105C. The nanocores 141, 151, and 161 respectively included in the first to third light-emitting areas 105A, 105B, and 105C may be electrically connected to a common n-type electrode 125 formed on the base layer 120, and the p-type semiconductor layers 143, 153, and 163 may be connected to p-type electrodes 180A, 180B, and 180C on the first to third light-emitting areas 105A, 105B, and 105C, respectively.

Accordingly, the first to third light-emitting areas 105A, 105B, and 105C of the semiconductor light-emitting device 100 may independently generate light. In some example embodiments, a p-type electrode 180A included in a first light-emitting area 105A may be connected to the second red switching device $TFT_{R2}$ in the pixel circuit. Accordingly, the plurality of light-emitting nanostructures 140 included in the first light-emitting area 105A may generate red light through currents applied by the first and second red switching devices $TFT_{R1}$ and $TFT_{R2}$ and the red capacitor $C_R$. Here, since the currents applied by the first and second red switching devices $TFT_{R1}$ and $TFT_{R2}$ and the red capacitors $C_R$ may be applied only to the p-type electrode 180A of the first light-emitting area 105A, the light-emitting nanostructures 150 and 160 included in the second and third light-emitting areas 105B and 105C may not emit light.

Similarly, a p-type electrode 180B included in a second light-emitting area 105B may receive currents via the first and second green switching devices $TFT_{G1}$ and $TFT_{G2}$ and green capacitors $C_G$. A p-type electrode 180C included in a third light-emitting area 105C may receive currents via the first and second blue switching devices $TFT_{B1}$ and $TFT_{B2}$ and blue capacitors $C_B$. Since the switching devices $TFT_{R1}$ to $TFT_{B2}$ and the capacitors $C_R$ to $C_B$ are connected to different scan lines $SCAN_{1R}$, $SCAN_{1G}$, and $SCAN_{1B}$ and different data lines $DATA_{1R}$, $DATA_{1G}$, and $DATA_{1B}$, by colors of light, each of the p-type electrodes 180A, 180B, and 180C may independently receive currents. Accordingly, various colors may be implemented by one semiconductor light-emitting device 100.

Meanwhile, referring to FIG. 3, the light-emitting nanostructures 140 having relatively greater distances than the other second and third light-emitting areas 105B and 105C may be formed in the first light-emitting area 105A. In some example embodiments, a distance $d_1$ between the light-emitting nanostructures 140 in the first light-emitting area 105A may be 1600 nm to 2300 nm, the distance $d_2$ between the light-emitting nanostructures 150 in the second light-emitting area 105B may be 1200 nm to 1600 nm, and a distance $d_3$ between the light-emitting nanostructures 160 in the third light-emitting area 105C may be 1000 nm to 1200 nm. Since the light-emitting nanostructures 140, 150, and 160 are formed by setting the distances $d_1$, $d_2$, and $d_3$ to be within the above-described numerical ranges and differences between the $d_1$, $d_2$, and $d_3$ to be at least 200 nm, red light, green light, blue light, and other various colors of light provided by mixing the three colors of light may be generated in one semiconductor light-emitting device 100.

In addition, although widths and heights of the nanocores 141, 151, and 161 respectively included in the first to third light-emitting areas 105A, 105B, and 105C are described as substantially the same, the widths and heights of the nanocores 141, 151, and 161 may be controlled so that the light-emitting nanostructures 140, 150, and 160 can generate red light, green light, and blue light, respectively. For example, as diameters of each of the nanocores 141, 151, and 161 decrease, thicknesses of the active layers 142, 152, and 162 respectively included in the light-emitting nanostructures 140, 150, and 160 may increase, a composition ratio of indium (In) thereof may increase, and wavelengths of light emitted from each of the light-emitting nanostructures 140, 150, and 160 may become longer. Accordingly, when the nanocores 141, 151, and 161 are formed in such a manner that the nanocores 141 included in the first light-emitting area 105A have the smallest diameter and the nanocores 161 included in the third light-emitting areas 105C have the greatest diameter, the first to third light-emitting areas 105A, 105B, and 105C may respectively emit red light, green light, and blue light.

Meanwhile, in terms of heights of the nanocores 141, 151, and 161, as the heights of nanocores 141, 151, and 161 decrease, thicknesses of the active layers 142, 152, and 162 may increase, and thus composition ratios of indium (In) included in the active layers 142, 152, and 162 may increase. When the nanocores 141 included in the first light-emitting area 105A have the smallest height and the nanocores 161 included in the third light-emitting area 105C have the greatest height, the first to third light-emitting areas 105A, 105B, and 105C may respectively generate red light, green light, and blue light.

Meanwhile, the p-type semiconductor layers 143, 153, and 163 may further include an electron-blocking layer formed adjacent to the active layers 142, 152, and 162. The electron-blocking layer may have a structure in which a plurality of n-type $Al_xIn_yGa_{1-x-y}N$ layers having different compositions, wherein 0≤x≤1, 0≤y≤1, 0≤x+y≤1, are laminated, or a structure in which one or more $Al_yGa_{(1-y)}N$ layers, wherein 0≤y≤1, are laminated. The electron-blocking layer may have a greater bandgap than the active layers 142, 152, and 162, and prevent electrons from being transmitted to the p-type semiconductor layers 143, 153, and 163.

Different from the nanocores 141, 151, and 161 including n-type semiconductor, the p-type semiconductor layers 143, 153, and 163 may include GaN doped with p-type impurities. Si is mainly used as the n-type impurities that are included as a dopant in the nanocores 141, 151, and 161. As the p-type impurities included in the p-type semiconductor layers 143, 153, and 163, Zn, Cd, Be, Mg, Ca, Ba, or the like may be used. Among them, Mg or Zn may be mainly used.

Figure 4:
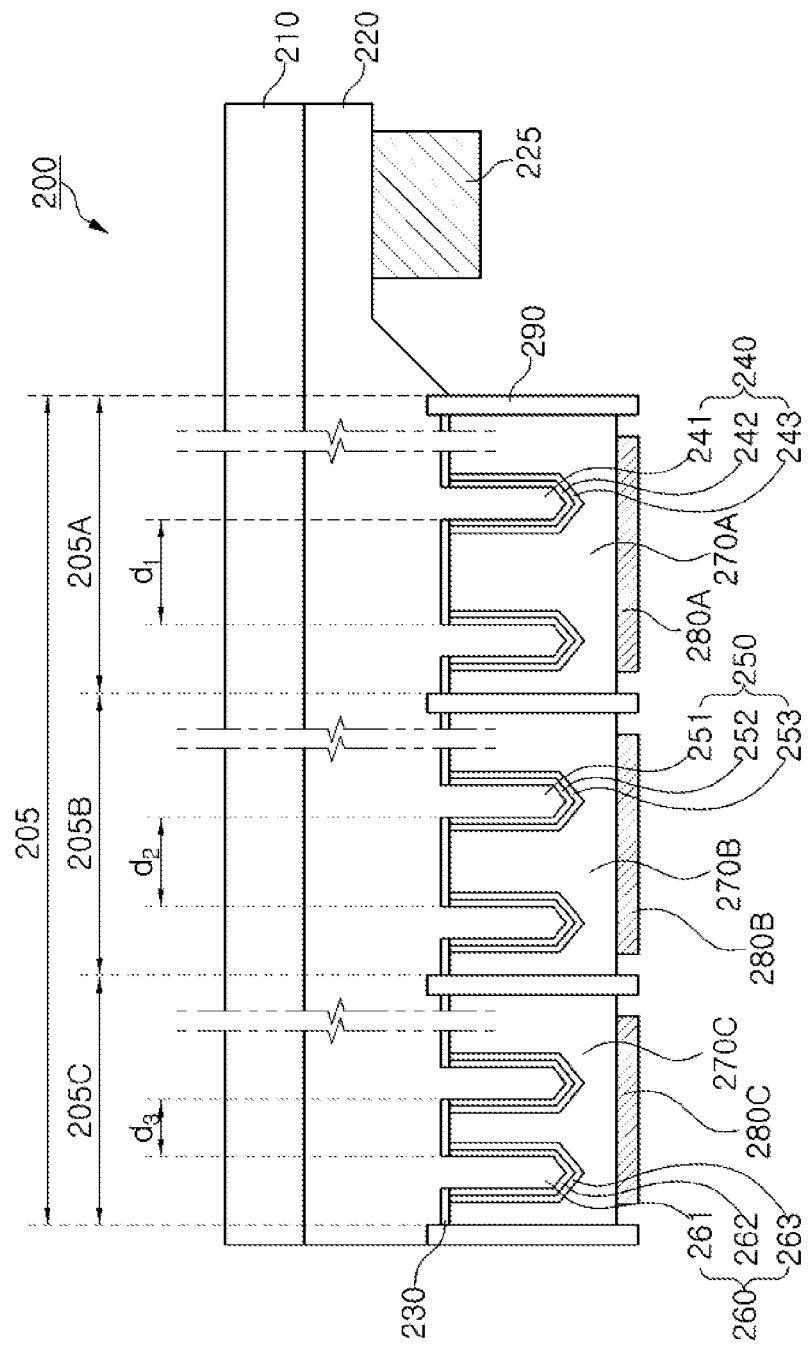

Next, referring to FIG. 4, a semiconductor light-emitting device 200 applicable to a display device 10 and a display panel 20 according to an example embodiment of the present inventive concept may have a flip chip structure. The semiconductor light-emitting device 200 may include a substrate 210, abase layer 220 disposed on the substrate 210, an insulating layer 230 disposed on the base layer 220, and a plurality of light-emitting nanostructures 240, 250, and 260 disposed on the base layer 220.

The substrate 210 may be an insulating, conductive, or a semiconductor substrate. Since light generated in the light-emitting nanostructures 240, 250, and 260 is emitted through the substrate 210, the substrate 210 may have high light transmittance. The base layer 220 may be a nitride semiconductor satisfying $Al_xIn_yGa_{1-x-y}N$ (0≤x≤1, 0≤y≤1, and 0≤x+y≤1), and may be formed on the substrate 210 doped with n-type impurities, such as Si, to have a specific-type conductivity.

The insulating layer 230 may be formed on the base layer 220 and provide a plurality of openings in order to form the plurality of light-emitting nanostructures 240, 250, and 260. The insulating layer 230 may be a kind of mask layer having the plurality of openings. By growing the base layer 220 through the plurality of openings of the insulating layer 230, nanocores 241, 251, and 261 may be formed. The nanocores 241, 251, and 261 may include an n-type semiconductor. For example, the nanocores 241, 251, and 261 may include n-type GaN.

Active layers 242, 252, and 262 and p-type semiconductor layers 243, 253, and 263 may be sequentially formed on the nanocores 241, 251, and 261. The active layers 242, 252, and 262 may have an MQW structure in which quantum well layers and quantum barrier layers are alternately stacked. In other example embodiments, the active layers 242, 252, and 262 may have an SQW structure. The p-type semiconductor layers 243, 253, and 263 may include p-type $Al_xIn_yGa_{1-x-y}N$. Transparent conductive layers 270A, 270B, and 270C including a transparent conductive material, such as ITO, ZnO, or IZO, may be formed on the p-type semiconductor layers 243, 253, and 263. In addition, the p-type semiconductor layers 243, 253, and 263 may include impurities, such as Zn, Cd, Be, Mg, Ca, or Ba.

The active layers 242, 252, and 262 and the p-type semiconductor layers 243, 253, and 263 may be formed to cover side and upper surfaces of the nanocores 241, 251, and 261. In the example embodiment of the present inventive concept, when diameters or heights of the nanocores 241, 251, and 261, or distances between the nanocores 241, 251, and 261 differ, the active layers 242, 252, and 262 having different compositions may be formed due to differences in lattice constants, specific surface areas, and strains. Thus, wavelengths of light generated in the light-emitting nanostructures 240, 250, and 260 may differ.

As described with reference to FIG. 3, as diameters or heights of the nanocores 241, 251, and 261 decrease, thicknesses of the active layers 242, 252, and 262 may increase and a content of indium may increase. Accordingly, wavelengths of light generated in the active layers 242, 252, and 262 may become longer. In addition, as distances between the nanocores 241, 251, and 261 increase, wavelengths of light generated in the active layers 242, 252, and 262 may increase. According to the example embodiment of the inventive concept, the first to third light-emitting areas 205A, 205B, and 205C may respectively generate red light, green light, and blue light by diameters and heights of the nanocores 241, 251, and 261 and distances between the nanocores 241, 251, and 261 being appropriately controlled.

That is, the semiconductor light-emitting device 200 may include the light-emitting area 205, and the light-emitting area 205 may include the first, second, and third light-emitting areas 205A, 205B, and 205C respectively generating red light, green light, and blue light. Light-blocking areas 290 may be disposed between the first to third light-emitting areas 205A, 205B, and 205C. The light-blocking areas 290 may isolate p-type semiconductor layers 243, 253, and 263 respectively included the first to third light-emitting areas 205A, 205B, and 205C. The nanocores 241, 251, and 261 may be electrically connected to a common n-type electrode 225 formed on the base layer 220, and the p-type semiconductor layers 243, 253, and 263 may be connected to different transparent conductive layers 270A, 270B, and 270C and p-type electrodes 280A, 280B, and 280C in the first to third light-emitting areas 205A, 205B, and 205C, respectively. Accordingly, the p-type semiconductor layers 243, 253, and 263 maybe connected to different switching devices $TFT_{R1}$ to $TFT_{B2}$ and capacitors $C_R$ to $C_B$ of the pixel circuit in the respective first to third light-emitting areas 205A, 205B, and 205C of the semiconductor light-emitting device 200, and may independently generate different colors of light.

Meanwhile, referring to FIG. 4, light-emitting nanostructures 240 having a relatively greater distance therebetween than the other second and third light-emitting areas 205B and 205C may be formed in the first light-emitting areas 205A. In some example embodiments, by forming the light-emitting nanostructures 240, 250, and 260 in the first to third light-emitting areas 205A, 205B, and 205C such that differences in distances d1, d2, and d3 between the nanocores 241, 251, and 261 are at least 200 nm, red light, green light, blue light, and other various colors of light provided by mixing the three colors of light may be generated in one semiconductor light-emitting device 200.

In addition, although diameters and heights of the nanocores 241, 251, and 261 respectively included in the first to third light-emitting areas 205A, 205B, and 205C are described as being substantially the same, the widths and heights of the nanocores 241, 251, and 261 may be controlled so that the light-emitting nanostructures 240, 250, and 260 generate red light, green light, and blue light, respectively. Here, the diameters or heights of the nanocores 241, 251, and 261 may be the smallest in first light-emitting area 205A and the greatest in the third light-emitting area 205C.

Meanwhile, the p-type semiconductor layers 243, 253, and 263 may further include an electron-blocking layer formed adjacent to the active layers 242, 252, and 262. The electron-blocking layer may have a structure in which a plurality of n-type $Al_xIn_yGa_{1-x-y}N$ layers having different compositions are laminated, or a structure in which one or more $Al_yGa_{(1-y)}N$ layers are laminated. The electron-blocking layer may have a greater bandgap than the active layers 242, 252, and 262 and prevent electrons from being transmitted to the p-type semiconductor layers 243, 253, and 263.

The semiconductor light-emitting device 200 illustrated in FIG. 4 maybe attached to a panel substrate using a flip-chip process . In one pixel P included in the display panel 20, the switching devices $TFT_{R1}$ to $TFT_{B2}$ and the capacitors $C_R$ to $C_B$ of each pixel circuit may be formed on a predetermined or desired panel substrate, and the semiconductor light-emitting device 200 may be disposed on the panel substrate to be connected to the switching devices $TFT_{R1}$ to $TFT_{B2}$ and the capacitors $C_R$ to $C_B$, and may form the pixel P.

Figure 5:
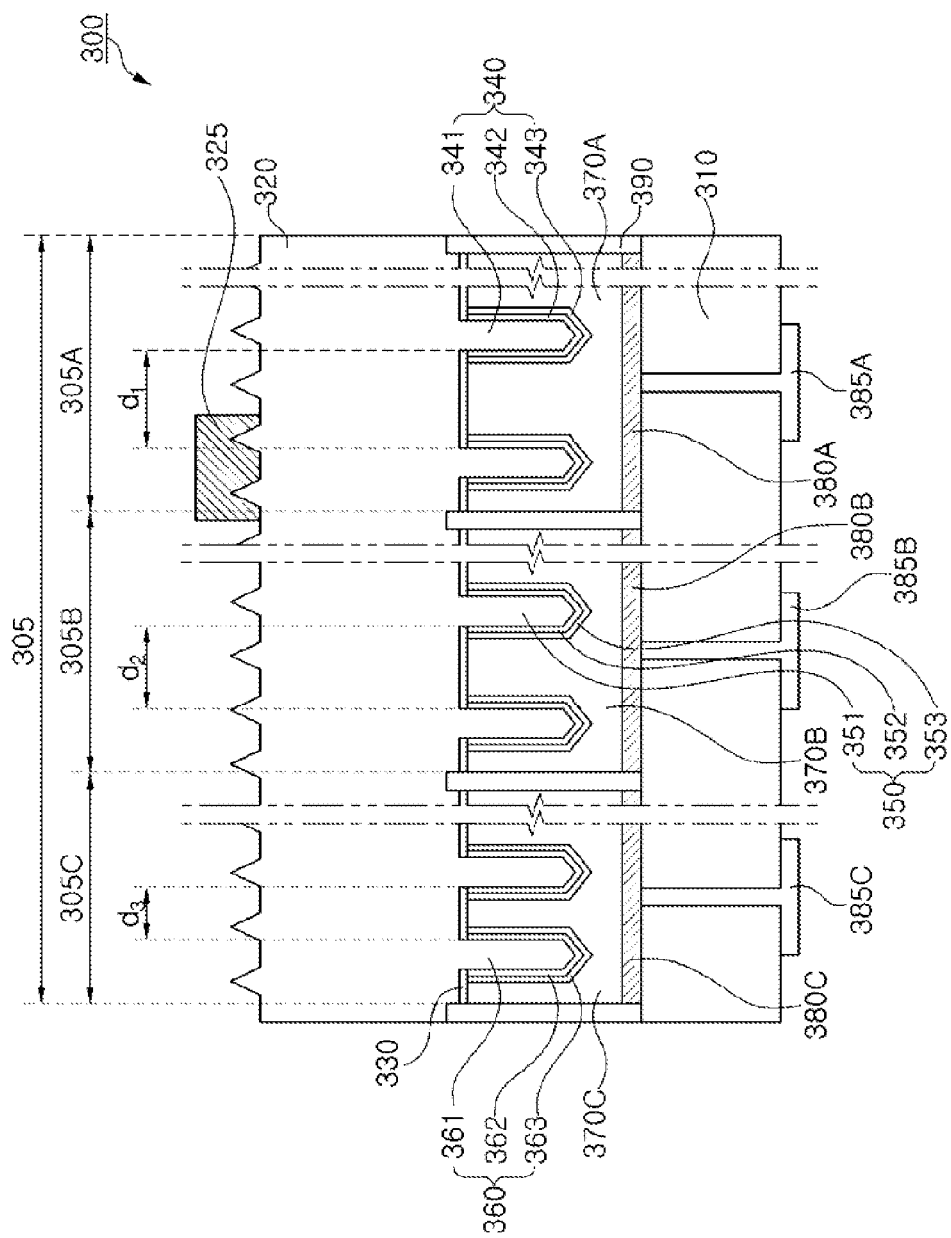

Next, referring to FIG. 5, a semiconductor light-emitting device 300 applicable to a display device 10 or a display panel 20 according to an example embodiment of the present inventive concept may include a substrate 310, abase layer 320, an insulating layer 330 having a plurality of openings, and a plurality of light-emitting nanostructures 340, 350, and 360. Unlike the example embodiments described above with reference to FIGS. 3 and 4, the substrate 310 in the example embodiments illustrated in FIG. 5 may not be a substrate for growing the base layer 320 but a support substrate attached after the plurality of light-emitting nanostructures 340, 350, and 360 are formed in a manufacturing process thereof. The substrate 310 may include Si.

The base layer 320 may be an n-type semiconductor layer, and include n-type GaN and Si as n-type impurities. The insulating layer 330 disposed on the base layer 320 may include $SiO_2$, SiN, $TiO_2$, $Si_3N_4$, $Al_2O_3$, TiN, AlN, $ZrO_2$, TiAlN, TiSiN, or the like, and provide a plurality of openings. A plurality of nanocores 341, 351, and 361 may be formed from the base layer 320 through the plurality of openings. As described above, wavelengths of light emitted from the first to third light-emitting areas 305A, 305B, and 305C may differ depending on diameters and heights of the plurality of nanocores 341, 351, and 361 and distances between the nanocores 341, 351, and 361.

Active layers 342, 352, and 362 and p-type semiconductor layers 343, 353, and 363 may be sequentially stacked on the nanocores 341, 351, and 361. The active layers 342, 352, and 362 may have an MQW structure or an SQW structure. For example, the active layers 342, 352, and 362 may have a structure in which GaN layers and InGaN layers are alternately stacked. The p-type semiconductor layers 343, 353, and 363 may include Mg, Zn, or the like as p-type impurities.

Similar to those described above with reference to FIGS. 3 and 4, the light-emitting nanostructures 340, 350, and 360 included in the first to third light-emitting areas 305A, 305B, and 305C may emit different colors of light. In order for the light-emitting nanostructures 340, 350, and 360 of the first to third light-emitting areas 305A, 305B, and 305C to independently emit different colors of light from each other, light-blocking areas 390 may be formed between the first to third light-emitting areas 305A, 305B, and 305C. The light-blocking area 390 may isolate the p-type semiconductor layers 343, 353, and 363 included in the first to third light-emitting areas 305A, 305B, and 305C.

Referring to FIG. 5, transparent conductive layers 370A, 370B, and 370C may be respectively formed on the p-type semiconductor layers 343, 353, and 363, first to third light-emitting areas 305A, 305B, and 305C, and first to third p-type electrodes 380A, 380B, and 380C may be respectively formed on the transparent conductive layers 370A, 370B, and 370C. Since the substrate 310 is disposed on the first to third p-type electrodes 380A, 380B, and 380C, the first to third p-type electrode 380A, 380B, and 380C may be connected to the plurality of switching devices $TFT_{R1}$ to $TFT_{B2}$ and capacitors $C_R$ to $C_B$ included in the pixel circuit through via electrodes 385A, 385B, and 385C. In the example embodiment illustrated in FIG. 5, the first to third p-type electrode 380A, 380B, and 380C may be directly attached to a panel substrate in which the pixel circuit is formed, and a common n-type electrode 325 may be connected to a reference voltage $V_{REF}$ line of the panel substrate through a conductive wire.

Figure 6:
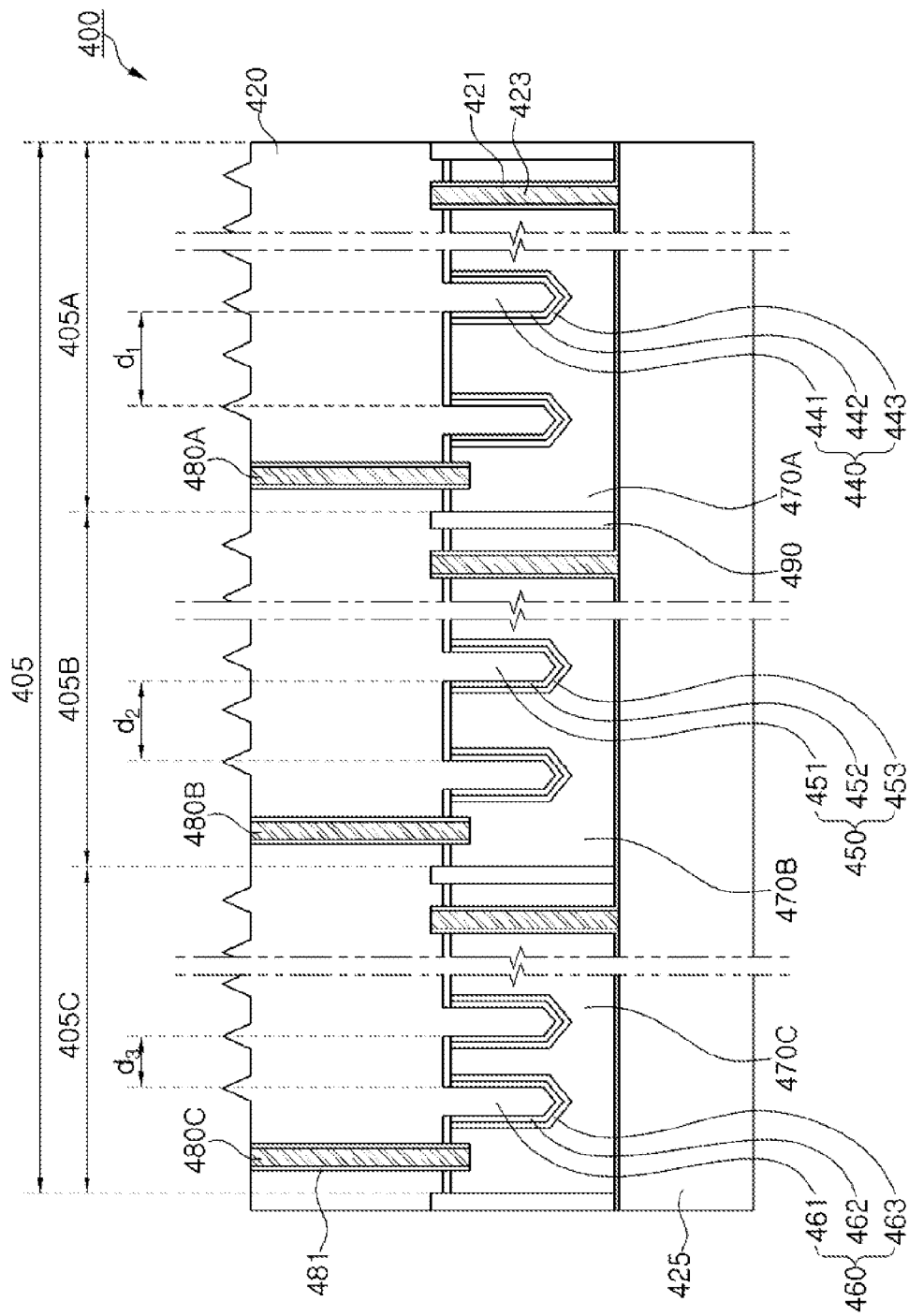

Next, referring to FIG. 6, a semiconductor light-emitting device 400 applicable to a display device 10 or a display panel 20 according to an example embodiment of the present inventive concept may include a base layer 420, an insulating layer 430 including a plurality of openings, and a plurality of light-emitting nanostructures 440, 450, and 460.

In the example embodiment illustrated in FIG. 6, unlike the example embodiment illustrated in FIG. 5, first to third p-type electrodes 480A, 480B, and 480C connected to p-type semiconductor layers 443, 453, and 463 may be formed on an upper side of the semiconductor light-emitting device 400, and a common n-type electrode 425 may be formed on an entire lower side of the semiconductor light-emitting device 400. Accordingly, when the semiconductor light-emitting device 400 is mounted on a panel substrate included in the display panel 20, since only the common n-type electrode 425 is connected to a reference voltage $V_{REF}$ line, a level of difficulty in a process of mounting the semiconductor light-emitting device 400 may be lowered. The first to third p-type electrodes 480A, 480B, and 480C formed on an upper side of the semiconductor light-emitting device 400 may be connected to a driving voltage $V_{DD}$ line of the panel substrate through a wire.

The semiconductor light-emitting device 400 according to the example embodiment illustrated in FIG. 6, the first to third p-type electrodes 480A, 480B, and 480C may include a p-type isolation insulating layer 481 in order to be electrically isolated from the base layer 420. In addition, since the common n-type electrode 425 is connected to the base layer 420 through a via metal 423, an n-type isolation insulating layer 421 may be formed to electrically isolated the via metal 423 from the p-type semiconductor layers 443, 453, and 463 and the transparent conductive layers 470A, 470B, and 470C.

The base layer 420 may include an n-type semiconductor material, and may be doped with impurities such as Si. According to diameters and heights of the nanocores 441, 451, and 461 formed from the base layer 420 or distances therebetween, colors of light generated in the first to third light-emitting areas 405A, 405B, and 405C may differ. In some example embodiment, by forming the nanocores 441, 451, and 461 in order to have the greatest distance in the first light-emitting area 405A and the smallest distance in the third light-emitting area 405C, the first to third light-emitting areas 405A, 405B, and 405C may respectively generate red light, green light, and blue light.

The first to third light-emitting areas 405A, 405B, and 405C may be isolated by light-blocking areas 490. The light-blocking areas 490 may electrically isolate the p-type semiconductor layers 443, 453, and 463 respectively included in the first to third light-emitting areas 405A, 405B, and 405C. Accordingly, the first to third light-emitting areas 405A, 405B, and 405C may independently generate different colors of light by the plurality of switching devices $TFT_{R1}$ to $TFT_{B2}$ and capacitors $C_R$ to $C_B$ connected to the first to third p-type electrodes 480A, 480B, and 480C.

Figure 7:
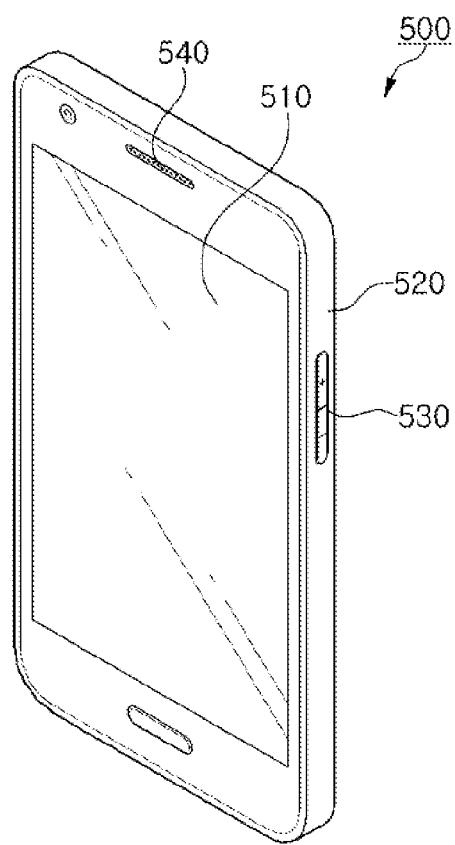
FIGS. 7 and 8 are diagrams illustrating electronic apparatuses to which a display device according to an example embodiment of the present inventive concept is applicable.
Figure 8:
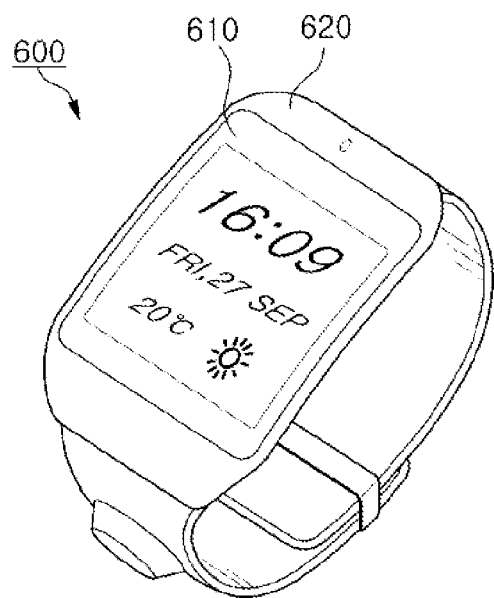

FIGS. 7 and 8 are diagrams illustrating electronic apparatuses to which a display device according to an example embodiment of the present inventive concept is applicable.

First, referring to FIG. 7, a display device 510 according to an example embodiment of the present inventive concept may be applied to a mobile apparatus 500 such as a smart phone. The mobile apparatus 500 may include the display device 510 according to the example embodiment of the present inventive concept, a housing 520, an input including a button 530, and an audio output 540. The display device 510 may display image transferred by a CPU embedded in the mobile apparatus 500.

The display device 510 may include a plurality of pixels according to the resolution thereof, and each pixel included in the display device 510 may include one of the semiconductor light-emitting devices 100 to 400 illustrated in FIGS. 3 to 6. As described above, intensity of each of red light, green light, and blue light generated in one semiconductor light-emitting device 100 to 400 may be independently controlled. Accordingly, unlike a normal technology in which one pixel includes a plurality of sub-pixels, a pixel and a semiconductor light-emitting device in the display device 510 according to the example embodiment of the present inventive concept may have a one-to-one relationship.

For example, when the display device 510 provides Full HD image having 1080 pixels in a row and 1920 pixels in a column, 2,073,600 semiconductor light-emitting devices 100 to 400 according to the example embodiment of the present inventive concept may be included to have one-to-one correspondence with a total of 2,073,600 pixels included in the display device 510. Accordingly, the display device 510 according to the example embodiment of the present inventive concept may consume relatively less power than conventional display devices in which red, green, and blue pixels are separately configured.

As application range of mobile apparatuses is enlarged and the products including thereof are diversified, mobile apparatuses providing a variety of functions are being widely used. In case of a smart phone or a tablet PC, various functions, such as web-browsing and gaming based on communication functions, SNS service functions, calling, documentation functions, and media (such as video and music) playing and editing functions, may be provided. Accordingly, a method of effectively using a limited capacity of a battery is emerging as an important topic in mobile apparatuses.

In general, a display device may consume the largest portion of battery power of a mobile apparatus. A light-emitting efficiency of a backlight unit in an LCD apparatus, and a light conversion efficiency of an OLED device in an organic light-emitting display device may have a significant effect on battery consumption. Since the display device 510 according to the example embodiment of the present inventive concept uses not a backlight unit used in conventional liquid display devices, but a semiconductor LED having a superior light conversion efficiency to an OLED device included an organic light-emitting display device, battery consumption may be effectively reduced when it is applied to the mobile apparatus 500.

Next, referring to FIG. 8, a display device 610 according to an embodiment of the present inventive concept may be applied to a wearable apparatus 600. As described above with reference to FIG. 7, the display device 610 including the semiconductor light-emitting devices 100 to 400 may effectively reduce battery consumption and may be effectively applied to the wearable apparatus 600 having a limited battery capacity.

Referring to FIG. 8, the wearable apparatus 600 according to the embodiment of the present inventive concept may include the display device 610 and a housing 620. The display device 610 may display image data transferred from a CPU embedded in the wearable apparatus 600, the number of pixels may correspond to the number of semiconductor light-emitting devices 100 to 400 in a one-to-one relationship. That is, one pixel may include one semiconductor light-emitting device 100 to 400. Here, as described above in the example embodiments of FIGS. 3 to 6, one semiconductor light-emitting device 100 to 400 may generate red light, green light, and blue light, and intensity of red light, green light, and blue light may be independently controlled. Accordingly, one pixel with no sub-pixel may implement an image.

As set forth above, an organic electro-luminescence device disposed in each pixel in conventional display devices may be replaced by a semiconductor light-emitting device according to various example embodiments of the present inventive concept. In particular, a semiconductor light-emitting device that emits all of red light, green light, and blue light in one chip may be applied to a display device. Accordingly, a display device operated with low levels of power consumption and implementing more natural colors by associating pixels to light-emitting devices in a one-to-one correspondence may be provided.

While example embodiments have been shown and described above, it will be apparent to those skilled in the art that modifications and variations could be made without departing from the scope of the present disclosure as defined by the appended claims.

What is claimed is:

1. A display device, comprising:
   a display panel including a plurality of pixels, each of the plurality of pixels including a plurality of switching devices, at least one capacitor, and a semiconductor light-emitting device; and
   a driving circuit configured to apply currents to the semiconductor light-emitting device through the plurality of switching devices and the at least one capacitor,
   wherein the semiconductor light-emitting device is configured to emit red light, green light, and blue light through the currents applied by the driving circuit;
   wherein the semiconductor light-emitting device includes a first light-emitting area configured to emit the red light, a second light-emitting area configured to emit the green light, and a third light-emitting area configured to emit the blue light;
   wherein the semiconductor light-emitting device includes a plurality of nanocores including n-type semiconductors, and active layers and p-type semiconductor layers that are sequentially formed on the plurality of nanocores, and the semiconductor light-emitting device does not include an organic material; and
   wherein a first distance between a first nanocore and an adjacent second nanocore in the first light-emitting area is different from a second distance between a third nanocore and an adjacent fourth nanocore in the second light-emitting area.

2. The display device of claim 1, wherein the first to third light-emitting areas respectively emit the red light, the green light, and the blue light through the currents that are applied through one common n-type electrode and different first to third p-type electrodes.

3. The display device of claim 2, wherein at least one of the one common n-type electrode and the first to third p-type electrodes is mounted, using a wire process, on a substrate on which the plurality of switching devices and the at least one capacitor are arranged.

4. The display device of claim 1, wherein the semiconductor light-emitting device is bonded, using a flip-chip process, on a substrate on which the plurality of switching devices and the at least one capacitor are arranged.

5. The display device of claim 1, wherein the semiconductor light-emitting device includes light-blocking areas disposed at boundaries between the first to third light-emitting areas.

6. The display device of claim 1, wherein each of the plurality of pixels includes at least one switching thin-film transistor (TFT) and at least one driving TFT.

7. A display device, comprising:
   a display panel including a plurality of pixels, each of the plurality of pixels including a pixel circuit and a semiconductor light-emitting device configured to emit red light, green light and blue light, the pixel circuit including a plurality of switching devices and at least one capacitor; and
   a driving circuit including a power supply configured to supply a driving voltage and a reference voltage, a scan driver configured to generate scan signals, a data driver configured to control a plurality of data lines, and a controller;
   wherein the semiconductor light-emitting device comprises a plurality of light-emitting nanostructures including a plurality of nanocores that include n-type semiconductors, and active layers and p-type semiconductor layers sequentially formed on the plurality of nanocores, and the semiconductor light-emitting device does not include an organic material; and
   wherein the plurality of light-emitting nanostructures are arranged at different distances in first to third light-emitting areas, and
   a first distance between a first nanocore and an adjacent second nanocore in the first light-emitting area is different from a second distance between a third nanocore and an adjacent fourth nanocore in the second light-emitting area.

8. The display device of claim 7, wherein the plurality of light-emitting nanostructures are separately disposed in the first to third light-emitting areas by a plurality of light-blocking areas.

9. The display device of claim 8, wherein the plurality of nanocores are connected to one common n-type electrode, and
   the p-type semiconductor layers are connected to first to third p-type electrodes respectively in the first to third light-emitting areas.

10. The display device of claim 9, wherein the first to third p-type electrodes are connected to different switching devices among the plurality of switching devices.

11. The display device of claim 8, wherein the plurality of light-emitting nanostructures disposed in the first light-emitting area emit red light,
    the light-emitting nanostructures disposed in the second light-emitting area emit green light, and
    the light-emitting nanostructures disposed in the third light-emitting area emit blue light.

12. A display panel comprising a plurality of pixels,
    wherein each of the plurality of pixels comprises:
    a semiconductor light-emitting device including a first light-emitting area configured to emit a first color of light, a second light-emitting area configured to emit a second color of the light, and a third light-emitting area configured to emit a third color of the light, the first to third light-emitting areas being configured to emit the first to third colors of the light through currents applied via a common n-type electrode and first to third p-type electrodes; and first to third pixel circuits connected to the first to third p-type electrodes, and configured to apply the currents to the first to third light-emitting areas;

wherein the semiconductor light-emitting device comprises a plurality of light-emitting nanostructures including a plurality of nanocores that include n-type semiconductors, and active layers and p-type semiconductor layers sequentially formed on the plurality of nanocores, and the semiconductor light-emitting device does not include an organic material, the plurality of light-emitting nanostructures are arranged at different distances in first to third light-emitting areas, and a first distance between a first nanocore and an adjacent second nanocore in the first light-emitting area is different from a second distance between a third nanocore and an adjacent fourth nanocore in the second light-emitting area.

13. The display panel of claim 12, wherein each of the first to third pixel circuits includes a plurality of switching devices and at least one capacitor.

14. The display panel of claim 12, wherein the first to third pixel circuits include a common reference line, and apply a reference voltage to the common n-type electrode through the common reference line.

15. The display panel of claim 12, wherein the first light-emitting area is configured to emit red light, the second light-emitting area is configured to emit green light, and the third light-emitting area is configured to emit blue light.

* * * * *